United States Patent [19]

Moses et al.

[11] Patent Number: 5,532,950
[45] Date of Patent: Jul. 2, 1996

[54] DYNAMIC DIGITAL FILTER USING NEURAL NETWORKS

[75] Inventors: Donald W. Moses, Eagan, Minn.; Charles H. Hustig, Hudson; James Kinne, River Falls, both of Wis.; Hossein L. Najafi, Minneapolis, Minn.

[73] Assignee: Wadia Digital Corporation, River Falls, Wis.

[21] Appl. No.: 232,733

[22] Filed: Apr. 25, 1994

[51] Int. Cl.$^6$ ...................................................... G06F 17/10
[52] U.S. Cl. ............................... 364/724.19; 364/724.02
[58] Field of Search ........................... 364/724.19, 724.2, 364/724.02, 724.01; 395/27

[56] References Cited

U.S. PATENT DOCUMENTS

| | | | |
|---|---|---|---|
| 5,058,047 | 10/1991 | Chung | 364/724.19 |
| 5,113,484 | 5/1992 | Jeong | 395/24 |
| 5,121,443 | 6/1992 | Tomlinson | 382/29 |
| 5,150,317 | 9/1992 | Countryman | 364/724.01 |
| 5,165,069 | 11/1992 | Vitt et al. | 358/335 |
| 5,184,218 | 2/1993 | Gerdes | 358/133 |
| 5,220,640 | 6/1993 | Frank | 395/2 |
| 5,222,193 | 6/1993 | Brooks et al. | 395/23 |
| 5,272,723 | 12/1993 | Kimoto et al. | 364/724.19 |
| 5,381,359 | 1/1995 | Abbott et al. | 364/724.19 |
| 5,396,657 | 3/1995 | Jokinen | 364/724.01 |

OTHER PUBLICATIONS

Cherkassky, V. and Najafi, H., "Constrained Topological Mapping for Nonparametric Regression Analysis", 4 Neural Networks pp. 27–40, 1991.

Rujan, P., "Feedforward Networks: from Theory to Technology", Proceedings of the Second International Workshop on Software Engineering, Artificial Intelligence and Expert Systems in High Energy and Nuclear Physics, L'Agelonde France-Te'le'com, 1992.

Minsky, M. and Papert, S., "Preceptrons", pp. 161–169, 1969.

Anderson, J. A., "A Simple Neural Network Generating an Interactive Memory", 14 Mathematical Biosciences pp. 197–220, 1972.

Widrow, B. and Hoff, M., "Adaptive Switching Circuits", 1960 IRE WESCON Convention Record, New York: IRE, 96–104, 1960.

McCulloch, W. and Pitts, W., "A Logical Calculus of the Ideas Immanent in Nervous Activity", 5 Bulletin of Mathematical Biophysics pp. 115–133, 1943.

Sejnowski, T. J. and Rosenberg, C. R. "NETtalk: A Parallel Network that Learns to Read Aloud", The Johns Hopkins University Electrical Engineering and Computer Science Technical Report JHU/EECS-86/01.

(List continued on next page.)

*Primary Examiner*—David H. Malzahn
*Attorney, Agent, or Firm*—Dorsey & Whitney

[57] ABSTRACT

The present invention provides an apparatus for decoding and classifying a digital audio input signal and for reconstructing the digital audio input signal, so that when the reconstructed signal is converted to an analog signal by a digital to analog converter ("DAC"), the analog signal can drive a preamplifier, power amplifier or speakers directly. In particular, the present invention proposes a digital filter than can be adapted to have appropriate filtering characteristics based on the signal being filtered. The invention uses a neural network to adjust coefficients of a digital filter, depending on whether the digital audio input signal is more periodic or more aperiodic. If the digital audio input signal is more periodic, the coefficients will configure the digital filter so that the filter has the characteristics of an analog brickwall filter. Whereas if the digital audio input signal is more aperiodic, the coefficients produced by the neural network will configure the digital filter to have more characteristics of an interpolation filter. The neural network is trained to recognize certain periodic and aperiodic signals and to produce digital filter parameters, preferably polynomial coefficients, correspondingly. The coefficients are selected to respond to the pure or blended periodic and aperiodic features of certain archetypal input signals.

21 Claims, 12 Drawing Sheets

OTHER PUBLICATIONS

Najafi, H., Nasiruddin, M., and Samad, T., "Effect of Initial Weights on Back-Propagation and its Variations".

Werbos, P. J., "Backpropagation: Past and Future".

Hecht-Nielsen, R., "Counterpropagation Networks".

Kohonen, T., "Self-organized Formation of Topologically Correct Feature Maps", 43 Biological Cybernetics pp. 59–69, 1982.

Lippmann, R. P., "An Introduction to Computing with Neural Nets", IEEE ASSP Magazine, Apr., 1987.

Rumelhart, D. E., Hinton, G. E., and Williams, R. J., "Learning Internal Representations by Error Propagation".

Hopfield, T. J., and Tank, D. W. "'Neural' Computation of Decisions in Optimization Problems", 52 Biological Cybernetics 141–152, 1985.

Grossberg, S., "Adaptive Pattern Classification and Universal Recoding: I. Parallel development and coding of neural feature detectors", 23 Biological Cybernetics 121–134, 1976.

Nguyen, D., and Widrow, B., "Improving the Learning Speed of Neural Networks by Choosing Initial Values of Adaptive Weights", 3 International Joint Conference on Neural Networks pp. 21–26, Jul., 1990.

Rosenblatt, F., "The Perceptron: A Probabilistic Model for Information Storage and Organization in the Brain", 65 Psychological Review 386–408, 1958.

Hopfield, J. J., "Neurons with graded response have collective computational properties like those of two state neurons", 81 Biophysics pp. 3088–3092, May, 1984.

Members of the Technical Staff Bell Telephone, "Wideband Channel Characteristics", Transmission Systems for Communication, (1971). The Graham Newsletter, 1990.

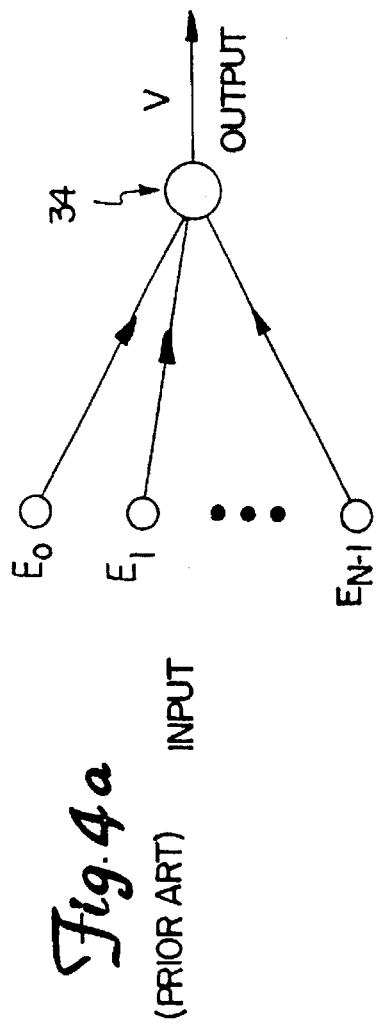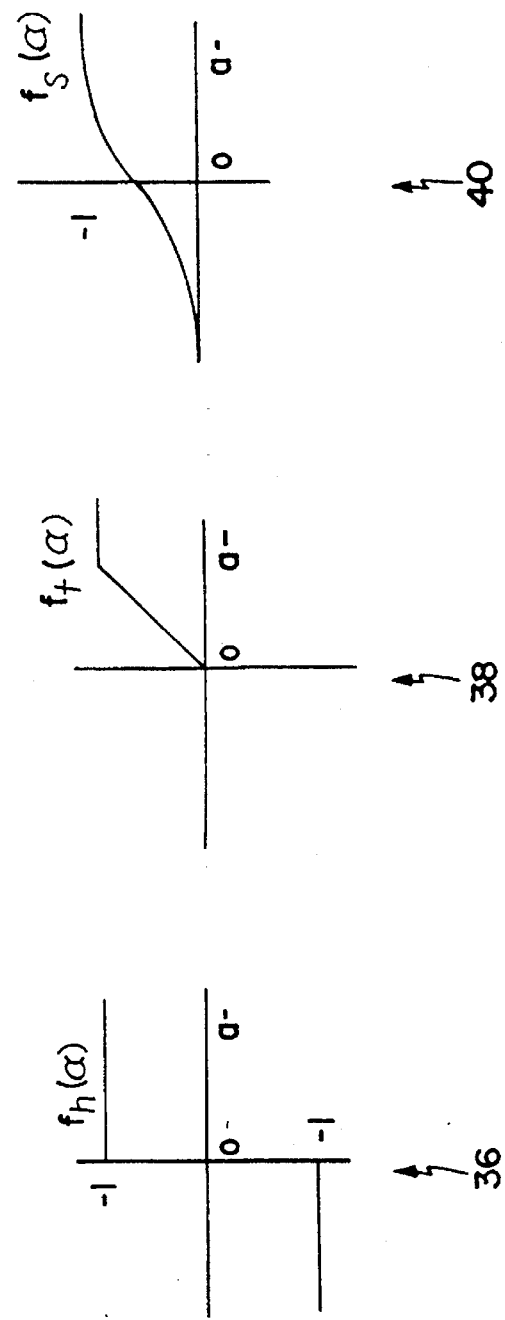
Fig. 4a (PRIOR ART)
Fig. 4b (PRIOR ART)
Fig. 4c (PRIOR ART)
Fig. 4d (PRIOR ART)

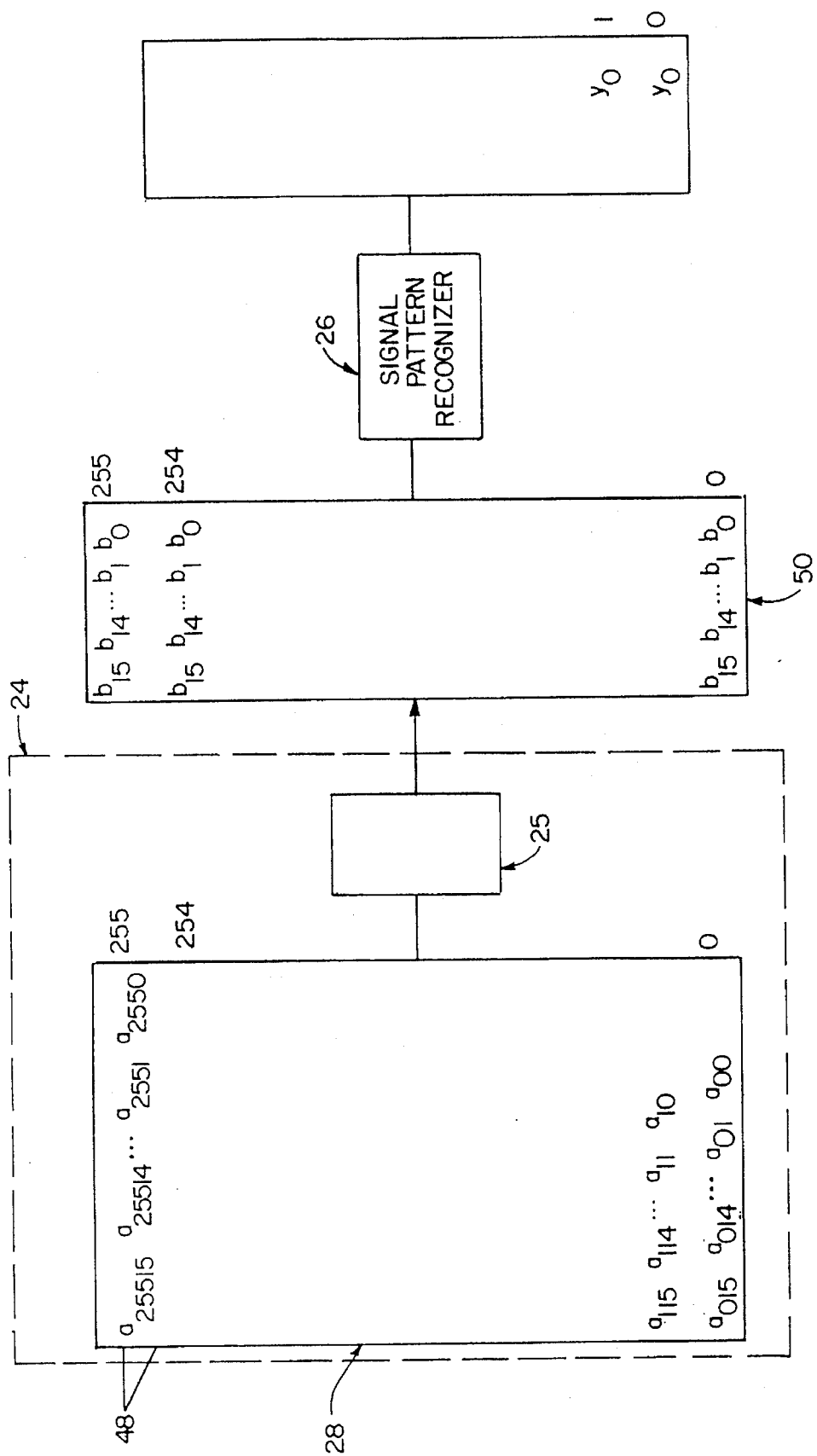

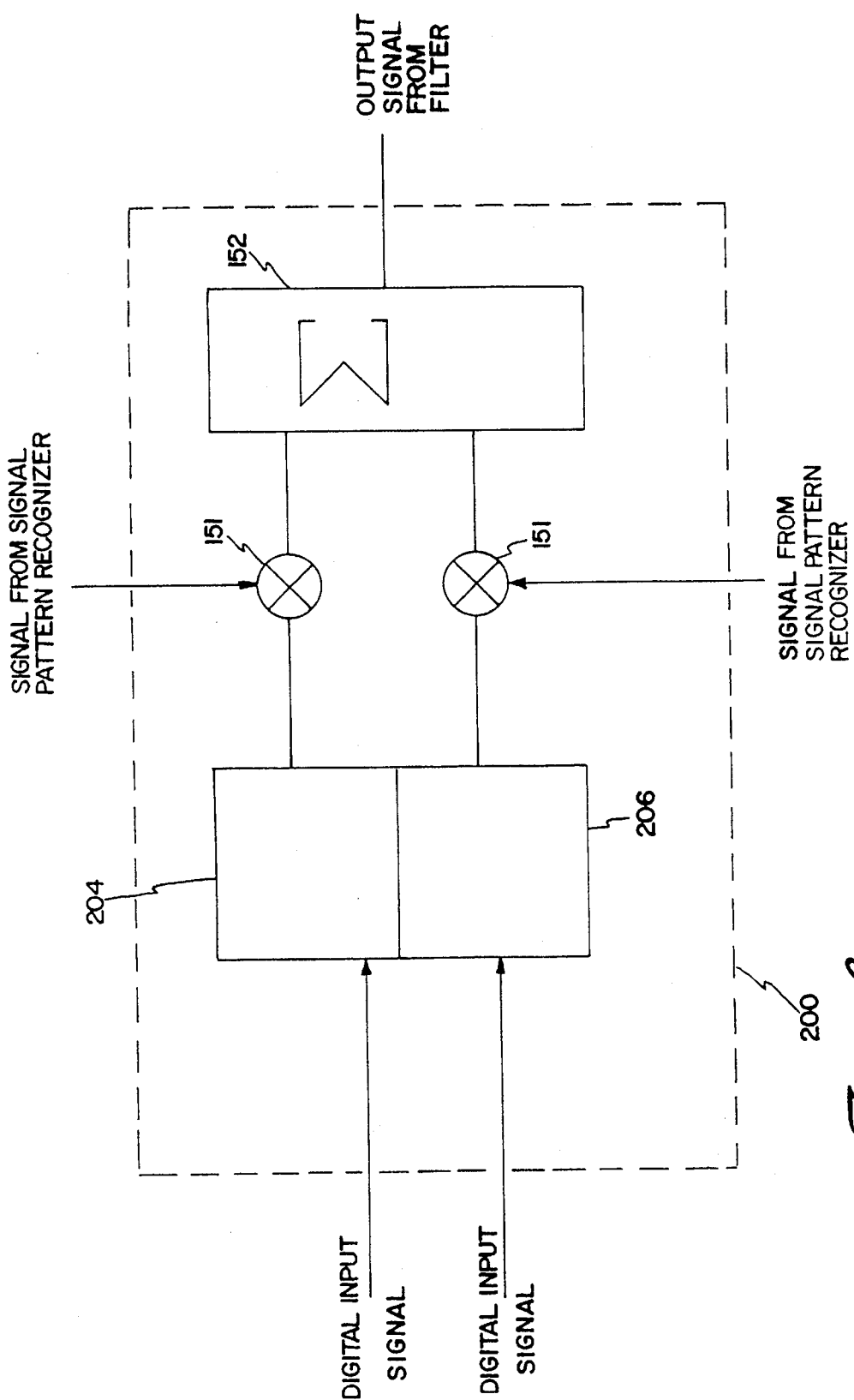

DYNAMIC DIGITAL FILTER USING NEURAL NETWORKS

TECHNICAL FIELD

The present invention relates generally to digital filters. More particularly, the present invention relates to dynamically changing the configuration of a digital filter using neural networks.

BACKGROUND OF THE INVENTION

Digital audio systems are well known in the prior art. Presently, two types of digital audio systems, the compact disc ("CD") and the digital audio tape ("DAT"), are enjoying commercial success as mass production audio reproduction systems. Digital audio systems have attracted critical listeners of professional or high-end analog systems.

The goal of any digital audio system is to sample and to reconstruct an analog audio signal, without noticeable changes to the signal, which will recreate authentic sounding music. If, for example, the audio signal is sampled at a recording studio and the digital samples are stored on a CD, then the CD player must retrieve the digital samples and reconstruct the waveform of the audio signal as closely as possible to the waveform of the original analog signal.

In theory, the sampling rate of a digital audio system is governed by the Nyquist Theorem that any signal may be sampled and reconstructed, provided the sampling rate is at least twice the highest frequency component of the original analog signal. An insufficiently high sampling rate tends to create an overlap in the reconstructed signal that gives rise to a special form of distortion known as aliasing. When the sampling rate is too low, the frequency domain images of the reconstructed signal overlap with the baseband and corrupt the higher frequency components of the baseband. Avoidance of aliasing is a primary goal of the sampling process of a digital audio system.

Because human hearing is usually considered to be band-limited to 20 KHz, some prior art digital audio systems have proposed that a 20 KHz bandwidth is sufficient for high quality and audio reproduction systems. The 20 KHz is based partly on tests where a subject is instructed to listen to a sinusoidal waveform that continuously increases in frequency and to determine when the signal becomes inaudible. Most people will not be able to detect such a signal once it reaches 20 KHz. The audio bandwidth of current CD systems is 20 KHz and the guard band is 2 KHz. Therefore, the digital sampling rate, in accordance with the Nyquist Theorem, is 44.1 KHz.

Transients are necessary for professional and high-end audio reproduction because they are important to human hearing in the reconstruction of wavefronts that yield the three-dimensional ambience associated with stereophonic signals. To most listeners of professional or high-end audio systems, it is critical that the reproduced music possesses this three-dimensional ambience where each individual sound source is perceived as being located on an imaginary sound stage. Indeed, the illusion of a stable three-dimensional sound image is the fundamental feature on which stereo sound is predicated.

Transients are also important in the resolution of the individual nuances of each of the sound sources. Natural music consists of characteristic noises and momentary silences between notes or overtone oscillations. It is important to prevent sonic blurring of these subtle nuances in the program material. Such details are easily destroyed by audio systems with poor transient response or excessive thermal noise and distortion, with the reproduced music sounding muddy and devoid of fine detail.

Currently, to reproduce high frequency transient signals in current digital audio systems, frequency domain brickwall filters are used to smooth the digital samples during the reconstruction of the analog audio signal. Theoretically, a frequency domain method of digital audio signal reconstruction should work if the low pass brickwall filter could ideally pass all signals below its threshold or roll-off frequency at unitary gain and reject all signals above its roll-off frequency, and if the distance between the digital sample points is small enough that information is not lost during the sampling process. Unfortunately, an ideal low pass filter cannot be realized for the real world of dynamic music material. It is possible to create a low pass brickwall filter that has excellent frequency domain specifications when driven by constant-energy-envelope sinusoids. When this brickwall or taut filter is driven by the transients and impulses of dynamic music material, it generates overshoot, ripple and ringing.

FIG. 8A shows the frequency response of a brickwall filter. The brickwall filter approximates an ideal low pass filter. The advantages of the brickwall filter are that it has a relatively flat passband 54. It has a steep transition band 56 and a stop band 58 that provides good image rejection.

Brickwall filters have two negative characteristics. First, brickwall filters inherently have small amplitude ripples 60 in the passband 54 caused by the steep transition band 56 (as shown in FIG. 8A).

This passband ripple 60 causes an echo in the impulse response which is one of the contributors of Digital Time Displacement Error ("TDE"). The amplitude of these echoes is directly proportional to the amplitude of the passband ripples. This echo limits the resolution of the transient signals because the digital filter echo is the limiting factor in specifying realizable bits of transient resolution.

Second, the steep transition band in a brickwall filter causes time domain ripples in response to transients and impulses. These time domain ripples are another contributor to TDE.

FIG. 8B shows the frequency response of a monotonic filter. The monotonic filter is characterized by the wide transition band 56. One advantage of the monotonic filter is that it does not produce an echo. Another advantage of the monotonic filter is that it has a better impulse response (which models a transient signal) than a brickwall filter. The monotonic filter has a good impulse response because of its wide transition band, i.e., the slow roll-off, which can be a drop off of 6 dB at half the sampling rate.

However, the monotonic filter has an image energy problem. It makes a high frequency sine wave look like it has a beat because it has a poor stop band performance.

It has been recognized that a digital filter could be used in signal reconstruction to perform "oversampling". The basic idea of the prior art oversampling techniques was to implement a digital low pass filter to carry out the function of the analog brickwall smoothing filters, with samples retrieved from the digital low pass filter at the higher oversampling rate.

To improve over frequency domain digital oversampling filters, it was proposed in U.S. Pat. No. 5,075,880 to Moses to perform the filtering function by working in the time domain and using interpolation techniques to reconstruct digital audio signals.

It has been recognized, however, that digital interpolation filters with either brickwall or with monotonic configurations have limitations. Neither is ideal for all types of signals. Brickwall filters have echo and introduce ringing artifacts into music due to their abrupt cut-off. Monotonic filters typically have level-drop at the highest passband frequencies and poor rejection of images.

What is needed is a digital filter that overcomes the disadvantages of having to use either a brickwall filter or a monotonic filter.

SUMMARY OF THE INVENTION

The present invention provides an apparatus for decoding and classifying a digitized audio input signal and for reconstructing the digitized audio input signal. In particular, the present invention proposes a digital filter than can be adapted to have selected, appropriate filtering characteristics. The invention uses a neural network to adjust coefficients of a digital filter, depending on whether the digital audio input signal is more periodic or more aperiodic. If the digital audio input signal is more periodic, the coefficients will configure the digital filter to be a digital brickwall filter. Whereas if the digital audio input signal is more aperiodic, the coefficients produced by the neural network will configure the digital filter to have more characteristics of a monotonic filter. The neural network is trained to recognize certain periodic and aperiodic signals and to produce digital filter parameters, preferably polynomial coefficients, correspondingly. The coefficients are selected to respond to the pure or blended periodic and aperiodic features of certain archetypal input signals.

The neural network is, of course, not trained on all signals that will be encountered when reconstructing music. However, after it is trained, the neural network will produce coefficients that will configure the digital filter such that the filter has an appropriate blend of the characteristics of both a brickwall filter and a monotonic filter when the input signal is not one on which the neural network was trained.

One object of the present invention is to provide an apparatus that allows the configuration of a digital filter used in signal reconstruction to be changed dynamically.

Another object of the present invention is to train a neural network to recognize selected input signals and produce corresponding digital filter parameters responsive to the periodic or aperiodic nature of the input signals.

A further object of the present invention is to provide a neural network apparatus that can configure a digital filter for signals the neural network was not trained, based on the signals on which the neural network was trained.

The above objects, advantages, and features of the present invention will become more apparent upon reference to the following description thereof with the appended drawings. However, before referring to the description and to the drawings, it is to be appreciated that the following description shows the presently preferred embodiments only. Accordingly, various modifications may be made to the invention without departing from the spirit and scope of the following described invention. It is to be further appreciated that to the extent like numerals are used in the various drawings, they describe like components.

BRIEF DESCRIPTION OF THE DRAWINGS

FIG. 4a shows a single node of a neural network as in FIG. 3.

FIGS. 4b–4d show three non-linear functions that can be implemented in the node of FIG. 4a.

FIG. 7 is a block diagram showing the relationship between the preprocessing means and the neural network in accordance with an alternative embodiment of the present invention.

FIG. 9C shows a block diagram representing a filter with two fixed filters, two multipliers, and a summer.

DETAILED DESCRIPTION OF THE PREFERRED EMBODIMENT

Figure 1:
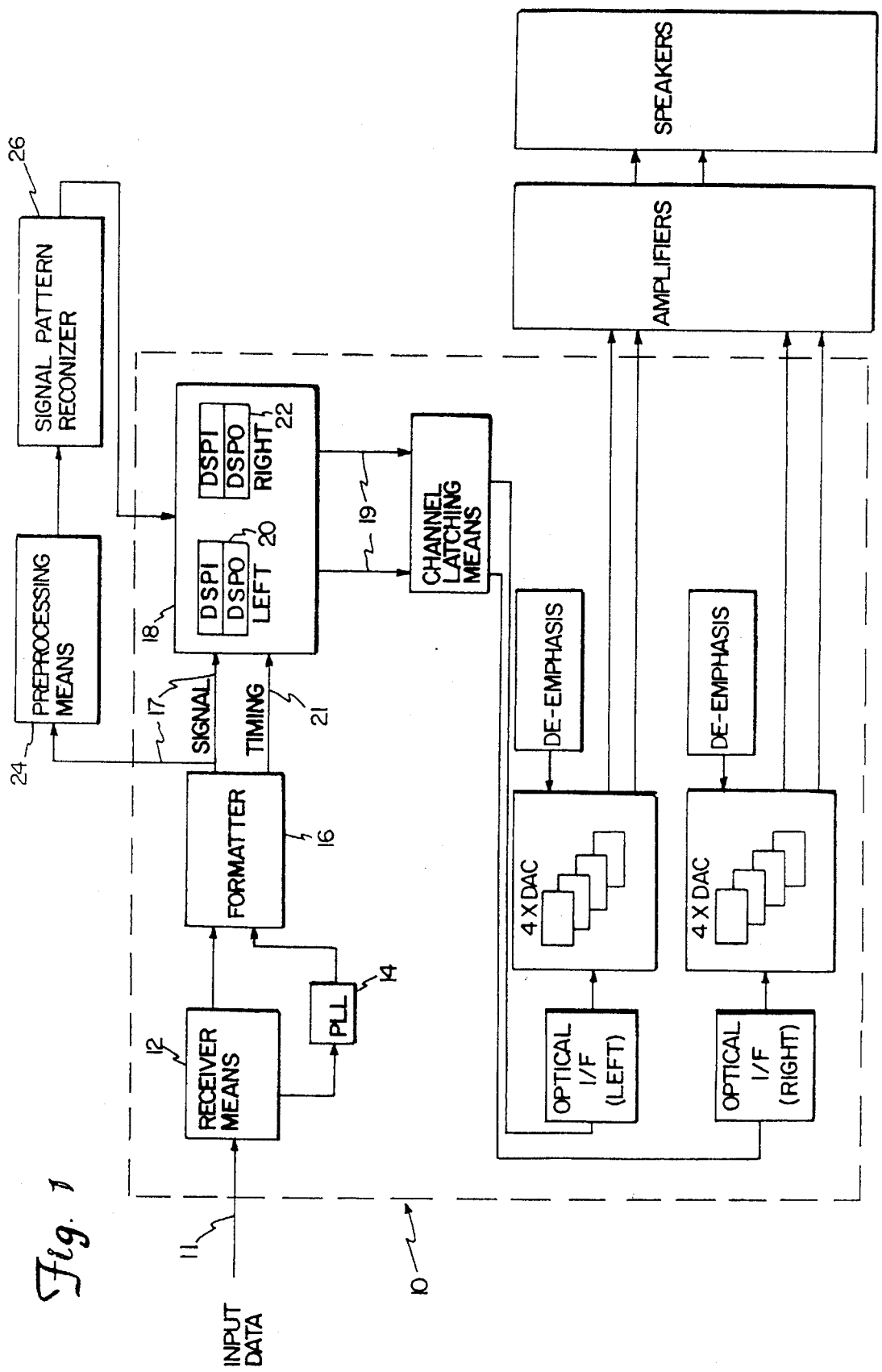
FIG. 1 is an overall block diagram showing the relationships among the components of a signal processing means in accordance with the present invention.

FIG. 1 illustrates one embodiment of the present invention integrated with a signal processing means 10 of a digital audio system. The signal processing means 10 receives Input Data 11 from a digital audio signal source (not shown). The Input Data 11 represent digital samples of musical material transmitted in a predetermined, conventional format. The Input Data 11 enter a receiver means 12 that synchronizes the Input Data 11 with an internal clock signal via a conventional phase-lock loop means ("PLL") 14. A formatter 16 performs the data demodulation and format decoding of the Input Data 11 to extract the Digitized Audio Input Signal 17 and the Timing Data 21 portions of the Input Data 11.

Although the description involves applying the present invention to sampled digital audio signals, the present invention can be used to dynamically configure a digital filter for any digital input signal where an adaptive filter can improve processing.

For instance, the present invention may be used in medical imaging. Currently, both brickwall filters and spline interpolation filters are used to reconstruct images. However, neither brickwall filters nor spline filters are the best filters for all images. Brickwall filters give higher contrast on some types of images, whereas spline filters minimize the spatial distortion problem, which is analogous to the TDE problem in audio.

This invention is also applicable to video signals. Currently, there is filtering for pure motion and no motion. However, rarely do these images occur separately. For instance, many images have a background in which there is no motion and there is motion in the foreground. These types of images combine motion and no motion components. Therefore, the present invention can be used to configure the filter for motion, no motion and a blend of the two filters of signals having both characteristics.

Satellite imaging and motion pictures have a similar problem with noise corrupting the image. When an image has no noise, then only minimal filtering should be done so as not to introduce other artifacts. If the images contain more noise, then more filtering should be done. The present invention would be applicable for dynamically changing filters according to the level of noise in the image to be reconstructed.

Similarly, in the areas of seismograph processing and sonar, the ability to distinguish between periodic and aperiodic signals and filter, accordingly, would make reconstruction of such signals more accurate.

The present invention can be used in computer multimedia in reconstructing compressed digital signals. This present invention can also be used in pattern and signature recognition.

The Digital Audio Input Signal 17 and the Timing Data 21 are then processed by a central processing means ("CPU") 18 that utilizes two digital signal processor means ("DSPs") 20, 22 to perform a time domain interpolation. This patent application incorporates by reference U.S. Pat. No. 5,075,880 to Moses in full, including its disclosure of a time domain interpolation and the description of the signal processing means 10 without the addition of preprocessing means 24 and the neural network 26. The DSPs 20, 22 and their software implement the digital filter that filters the Digital Audio Input Signal 17 in accordance with the present invention, and a signal pattern recognizer 26 provides filter parameters to the digital filter.

Figure 2:
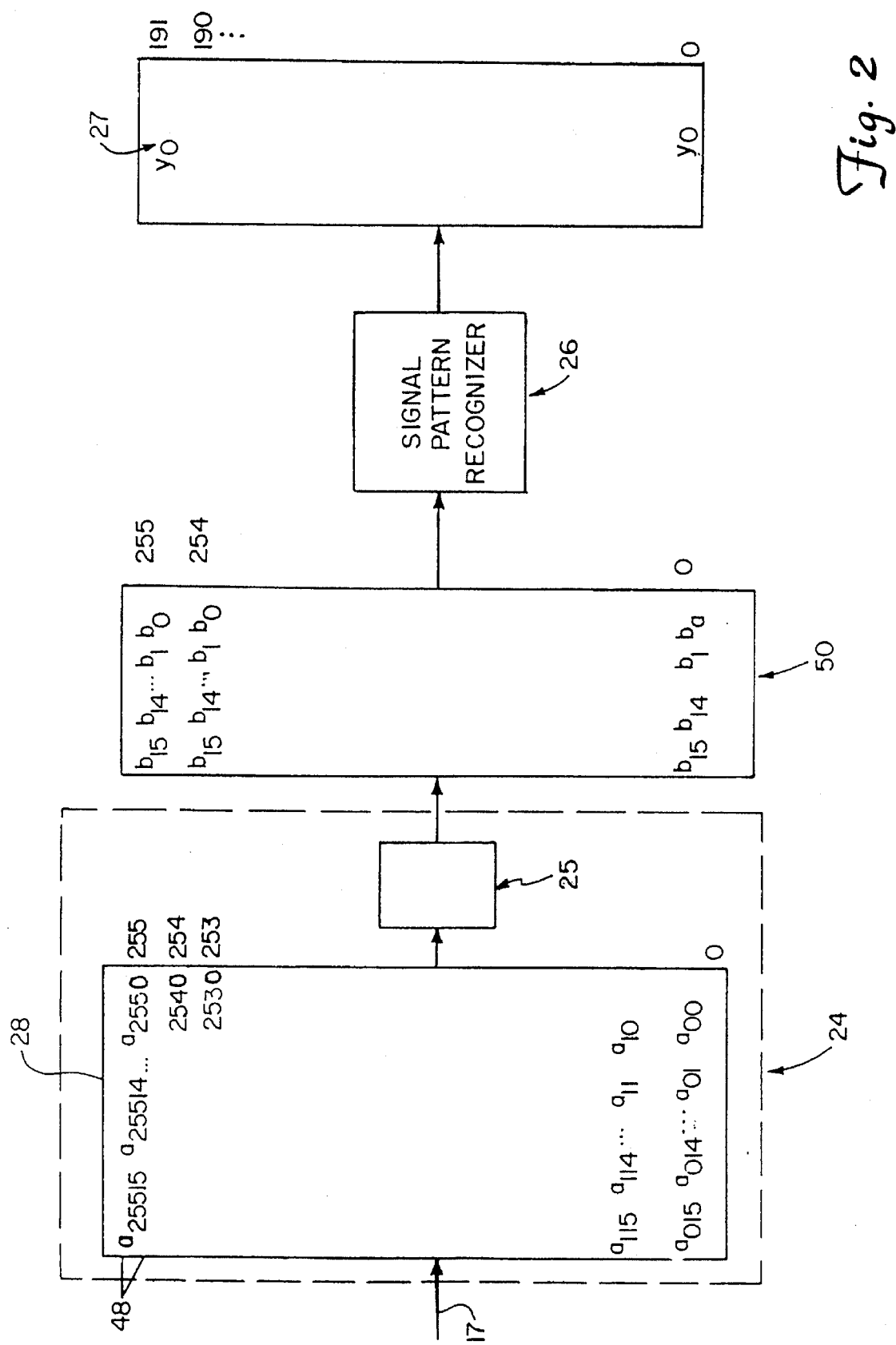
FIG. 2 is a block diagram showing the relationship between the preprocessing means and the neural network in accordance with the present invention.

As shown in FIG. 2, each Digital Audio Input Signal 17 is a 16-bit time domain representation of an audio signal sampled at 44.1 Khz (Kilohertz), or 44,100 samples/second. Each sample includes a 16-bit time domain representation of the magnitude of the analog audio signal. The Digital Audio Input Signal 17 is provided by a source such as a CD or a DAT.

A buffer 28, which is part of the preprocessing means 24, accumulates 256 such samples in a signal set 48. This set 48 of 256 Digital Audio Input Signals 17 is preferably inputted to a signal preprocessor 25, which is also part of the signal preprocessor means 24. The preprocessor 25 may perform a Fast Fourier Transform ("FFT"), a Power Spectral Density Transform ("PSD"), a Discrete Cosine Transform ("DCT"), or a Hilbert Transform ("HT"). Depending on the type of signal processor 25 used, the original time domain signal set 48 may be transformed into the frequency domain on some other domain that facilitates downstream processing. However, to practice the present invention, a signal preprocessor 25 is not necessary.

The set 48 of Digital Audio Input Signals 17 is received by the signal pattern recognizer 26, either with or without preprocessing. The signal pattern recognizer 26 is a means for classifying a set of signals and outputting filter parameters. There are two types of signal pattern recognizers 26: a Spectral Flatness Analyzer ("SFA") and a neural network.

A Spectral Flatness Analyzer 26 can be implemented via software to determine the periodicity and aperiodicity of a set 48 of Digital Audio Input Signals 17. The Spectral Flatness Analyzer 26 converts the set 48 of Digital Audio Input Signals 17 to a power spectrum representation. Then, a ratio known as the Spectral Flatness Measure is calculated. The equation to calculate spectral flatness measure is:

$$\text{Spectral Flatness Measure} = \frac{\text{Geometric Mean of the Power Spectrum}}{\text{Arithmetic Mean of the Power Spectrum}}$$

This Spectral Flatness Measure is then converted to dB. If the Spectral Flatness Measure is −60 dB, then the signal is periodic. If the Spectral Flatness Measure is 0 dB, then the signal is aperiodic. This SFA may be used to output a digital filter parameter which would switch the digital filter configuration between two fixed filter configurations, wherein one filter is optimally configured for periodic signals and the other filter is optimally configured for aperiodic signals. The SFA may also output a digital filter parameter which is a weighting signal.

In addition to the SFA, a neural network 26 can be used to classify a set 48 of Digital Audio Input Signals 17 and output filter parameters. The set 48 of Digital Audio Input Signals 17 can be directly inputted into the neural network 26 to stimulate an output 27. The output 27 of a neural network 26 is a digital filter parameter, which can be as complete as a set of filter coefficients, it can be a simple binary value, or it can be a weighting signal. For instance, in the embodiment as shown in FIG. 2, 192 coefficients, preferably the coefficients of a polynomial used in filter modeling, can be the output 27 by the neural network 26. Also, the neural network 26 may output a simple binary value to switch between two fixed digital filters.

Also, the output 27 of the neural network 26 may be a weighting. As shown in FIG. 7, in another embodiment, the neural network 26 will output a first weighting signal between 0 and 1 indicating the degree of periodicity of Digital Audio Input Signals 17 and a second weighting signal between 0 and 1 indicating the degree of aperiodicity.

If an FFT signal preprocessor 25 is used, it will output to buffer 50 frequency domain representations based on the set 48 of Digital Audio Input Signals 17. During the operation of the signal processing means 10, these frequency domain representations in buffer 50 are inputted into the neural network 26, which then provides 192 coefficients corresponding to the 192 taps on the digital filter implemented in DSPs 20, 22.

In the preferred embodiment, a time domain interpolation filter is utilized to oversample the Digital Input Audio Signals 17. The 192 coefficients output from the neural network 26 modify the actual interpolation coefficients of the interpolation filter implemented in the DSPs 20, 22.

The effect of this modification is that the characteristics of the interpolation filter are modified to be a pure brickwall interpolation filter, or a pure monotonic interpolation filter, or a blend of the characteristics of the two filters. The resulting digital filter is responsive to the set 48 of 256 Digital Audio Input Signals 17. The Interpolated Signal 19 is outputted from the DSPs 20, 22 and converted into an Analog Output Signal by means of two groups of digital-to-analog converters.

As noted above, the signal preprocessor 25 is not necessary to practice the present invention and may be left out of the preprocessor means 24. In such an embodiment, the input to the neural network 26 will be the set 48 of 256 time domain Digital Audio Input Signals 17. During the operation of the signal processing means 10, these time domain signals 17 are inputted into the neural network 26 which again provides 192 coefficients corresponding to the 192 taps on an interpolation digital filter implemented in the DSPs 20, 22 and adapted for time domain signals 17. These coefficients modify the actual interpolation coefficients used in the DSPs 20, 22.

We turn next to a discussion of the filter characteristics that may be realized through various selections of the 192 coefficients output by the neural network 26. The digital filter implemented in the DSPs 20, 22 should be flexible enough to permit a wide variety of filter configurations, including a brickwall filter. A brickwall filter is in the class of equiripple filters. Such filters have a sharp transition band, a passband having small amplitude ripples, and a stop band. In addition to the brickwall filter, other types of equiripple filters include Chebyshev filters, elliptic filters, and windowed filters.

Another possible filter implementation is a monotonic filter which does not have the ripples in the passband found in brickwall filters. A monotonic filter is characterized by a wide transition band. There are several types of monotonic filters including: Lagrangian filters, Cubic-spline ("C-spline") filters, spline filters in general, all-pass filters, Bessel-Thompson filters, and the Butterworth filter. C-spline filters are preferably used in the present invention.

In the present invention, the digital filter in the DSPs 20, 22 can be configured to have characteristics of both a brickwall filter and a monotonic filter. A blend of the two broad filter types would mean narrowing the transition band which would make it steeper. If the set 48 of Digital Audio Input Signals 17 has characteristics of both a periodic signal and an aperiodic signal, then the neural network will provide coefficients modeling a digital filter which is a blend of an equiripple filter and a monotonic filter.

To explain how the present invention adapts to input signals and dynamically changes filter characteristics, it is necessary to discuss the structure and training of the neural network 26. The neural network 26 is a dense interconnection of simple computational elements or nodes. Such neural networks are specified by the network's topology, node characteristics, and training or learning rules.

Figure 3:
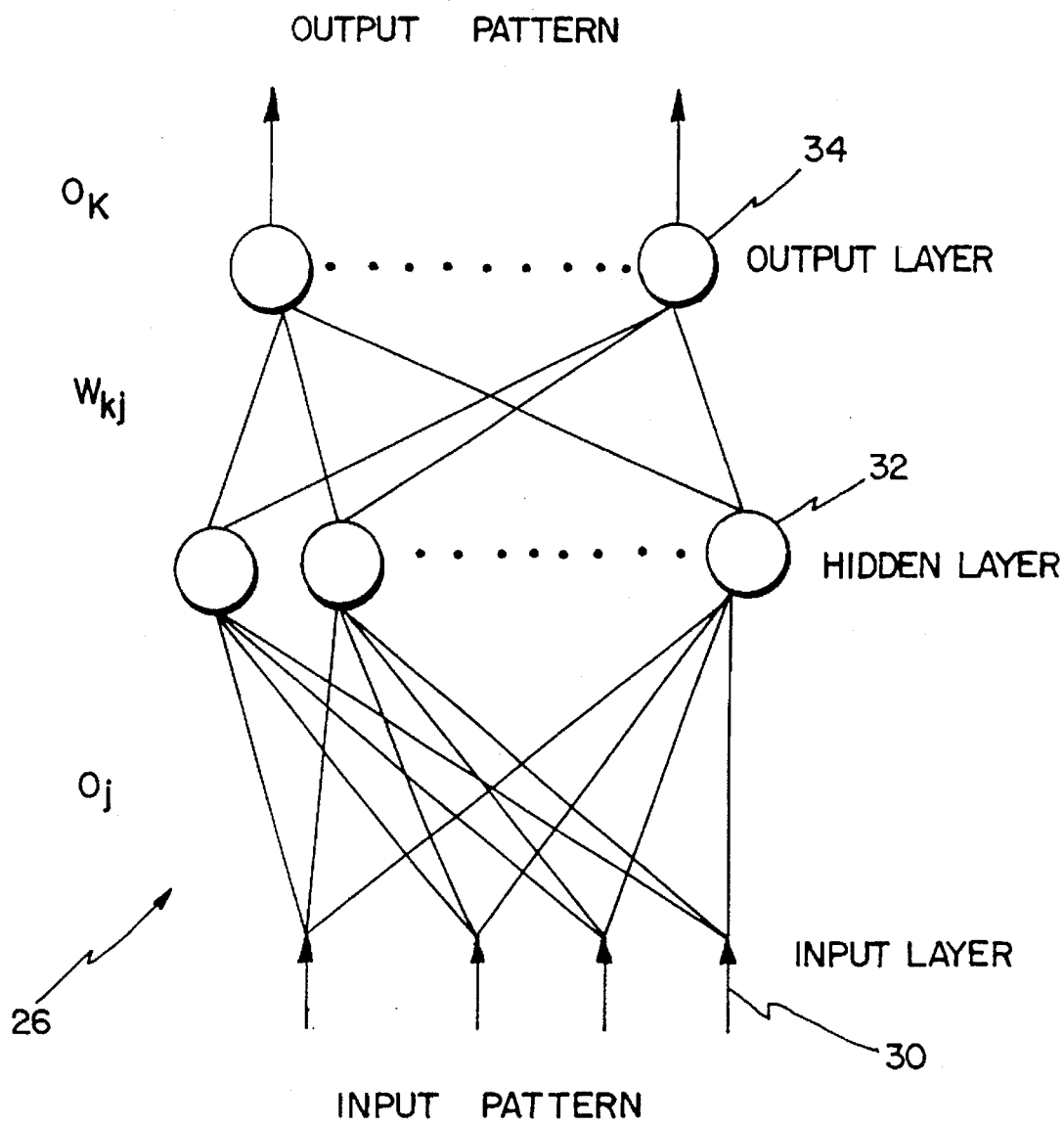
FIG. 3 illustrates a multi-layered neural network as used in the present invention.

In the preferred embodiment, the neural network's topology is a three-layer, feed-forward neural network 26 as illustrated in FIG. 3. The three-layer neural network 26 has continuous valued inputs 30, output nodes 34, and one layer of hidden nodes 32. Such a neural network 26 is well suited for classification problems such as classification of audio signals.

The hidden nodes 32 used in a neural network 26 are usually nonlinear. The output of each node is found by first determining a weighted sum of its inputs and then applying a nonlinear transformation on the result. FIG. 4a shows a computational element or node 34 which forms a weighted sum of N inputs and passes the result through a nonlinearity. Three representative nonlinearities are shown in FIGS. 4b–4d: a hard limiter 36, a threshold logic 38, and a sigmoid 40. In the present invention, the nodes in the hidden layer 32 use the sigmoid 40 and the nodes in the output layer 34 are either the sigmoid nonlinearity 40 or use linear nodes (i.e., no nonlinearity is applied to the output of these nodes).

The learning rule specifies an initial set of weights and indicates how weights should be incrementally adjusted during training to improve performance. There exist many algorithms to train a neural network classifier. Popular and commonly used examples of such algorithms are the perception convergence algorithm, the Widrow and Hoff algorithm, the adaptive resonance algorithm, Kohonen's self-organization algorithm, the Hopfield algorithm, the back-propagation algorithm, and the counter propagation algorithm. See the following references for a description of these and other training algorithms.

F. Rosenblatt (1959), *"The perception: a probabilistic model for information storage and organization in the brain"*, Principles of Neurodynamics, Spartan Books, New York D. E. Rumelhart, G. E. Hinton, and R. J. Williams (1987), *"Learning Internal Representations be Error Propagation"*, In David E. Rumelhart and James L. McClelland, editors, *Parallel Distributed Processing: Explorations in the Microstructure of Cognition*, Volume 1, pages 318–362, MIT Press: Bradford Books T. Kohonen, (1982), *Self-Organized Formation of Topologically Correct Feature Maps*, Biological Cybernetics 43, Spring-Verlag, 59–69.

R. Hecht-Nielsen (1987), *"Counterpropagation Networks"*, Applied Optics, Vol 26, 4972–4984.

Hopfield, J. J. and Tank, D. W., (1985), *Neural Computation of Decision in Optimization Problems*, Biological Cybernetics. Volume 58, 63–70.

Widrow, B. and Hoff, M. E. (1960) *"Adaptive Switching Circuits"*, 1960 IRE WESCON Convention Record, New York: IRE, 96–104.

Grossberg, S. (1976) *"Adaptive Pattern Classification and Universal Recoding"*, II: Feedback, Expectation, Olfaction, and Illusions. Biological Cybernetics, 23, 187.

Figure 5:
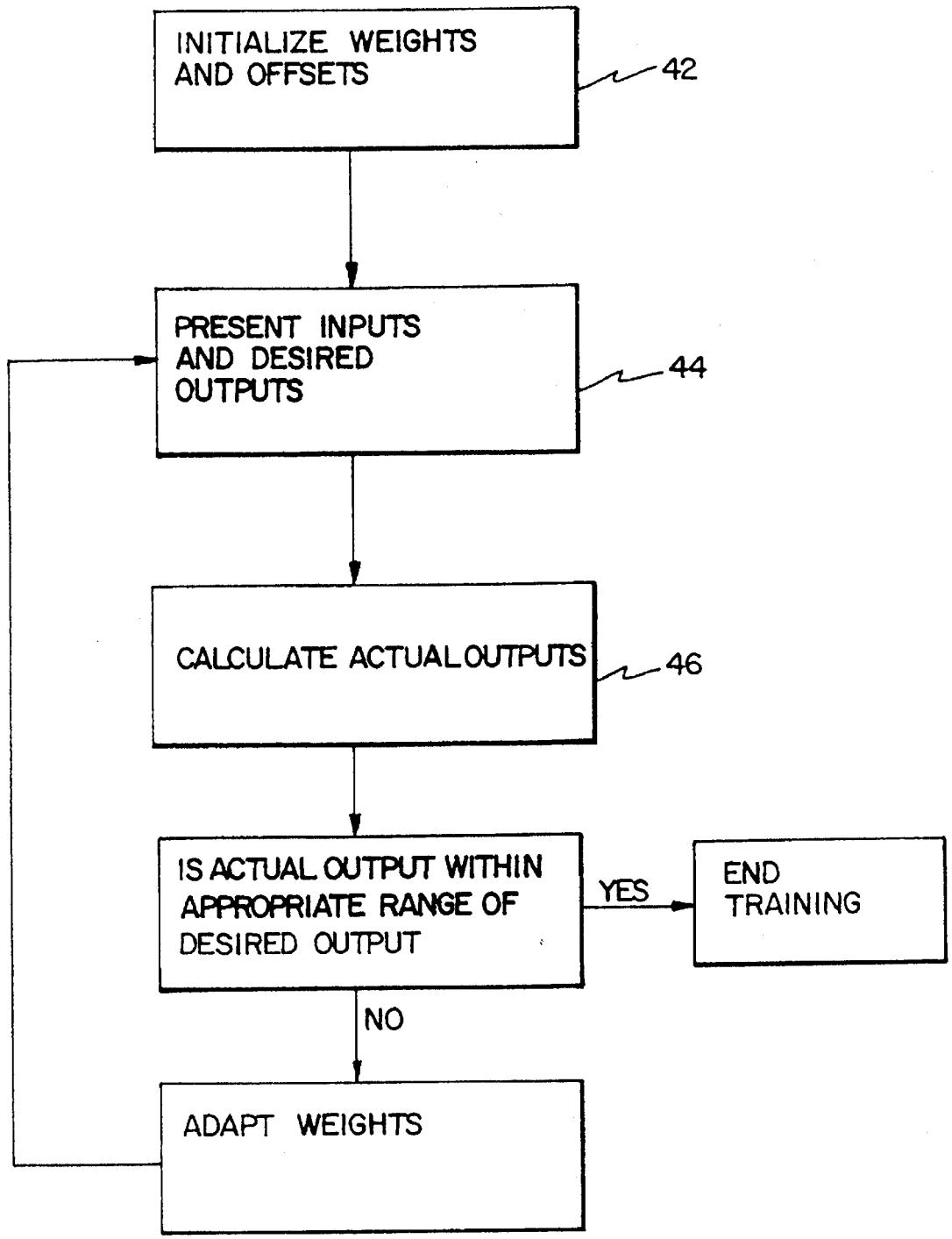
FIG. 5 shows a flow chart of the back propagation training algorithm as used in the present invention.

In the preferred embodiment, the back-propagation algorithm is used to train the neural network 26. FIG. 5 is a flow chart describing the steps used in training the neural network 26 using a back-propagation training algorithm. The back-propagation training algorithm is an iterative gradient search technique that minimizes a cost function equal to the mean square error between the actual output of a multilayer feed-forward neural network and the desired output.

Before the training begins, all connection weights of the network 26 are initialized 42. The initial weights are usually generated randomly in a small range, e.g., between −0.3 to +0.3. However, in some situations, it is possible to pick the initial weights of the network base on the training set itself. This modification could improve the learning speed of the network. See, D. Nguyen, B. Widrow, "Improving the Learning Speed of Neural Networks by Choosing Initial Values of Adaptive Weights," International Joint Conference on Neural Networks, Vol 3, pp. 21–26, July 1990, for a description of setting initial weights. After the weights are initialized, the algorithm will repeat a sequence of steps that are described next until a desired performance is achieved.

The first training step 44 involves presenting a continuous valued input vector $X_0, X_1, \ldots X_{N-1}$ wherein each X refers to the 16-bit Digital Audio Input Signal 17 and specifying the desired outputs $D_0, D_1, \ldots D_{M-1}$, wherein each D represents an output Y as shown in FIG. 2. In the present invention case, the input vector is the contents of buffer 50, consisting of 256 16-bit numbers, which would be a digital representation of the audio signal. The desired outputs would be a set of 192 coefficients that would correspond to the filter characteristics to be realized in DSPs 20, 22 deemed optimal for the signal characterized by the input vector.

The second training step 46 involves forward propagating the input signals through the network 26, using a prespecified nonlinearity function, and calculating the output vector $Y_0, Y_1, \ldots Y_{M-1}$. Then, the actual outputs are compared to the desired outputs. If the actual outputs are within an acceptable range of the desired outputs, then the neural network 26 is considered trained. However, if the actual outputs are not within an acceptable range of the desired outputs, the weights of the network 26 are modified to reduce the difference between the desired and the actual outputs.

The rule for changing weights following presentation of a given input/output vector pair p is given by:

$$\Delta_p W_{ij} = \eta \delta_{pj} O_{pi}$$

where $\Delta_p$ is $W_{ij}$ the change to be made to the weight connecting the node i to the node j following the presentation of input/output vector pair p; $\eta$ is the learning rate factor; $\delta_{pj}$ is an error signal calculated for the receiving node j after presentation of the input/output vector pair p; and $O_{pi}$ is the output value of the sending node i after the presentation of the input/output vector pair p.

The learning rate factor $\eta$ can be set to a small value such as 0.1 and be kept constant throughout training; or it can be dynamically adapted based on the value of the output error. For example, if the new error (i.e., error found after presentation of the current input/output pair) exceeds the old error (i.e., error found after presentation of the last input/output pair) by more than a predefined ratio (typically 1.04), the learning rate is decreased. Otherwise, the learning rate is increased.

The determination of the error signal $\delta_{pj}$ is a recursive process that starts with the output nodes 34 of the network 26. For output nodes 34, the error signals are calculated using:

if sigmoid 40 nonlinear nodes are used:

$$\delta_{pj} = (T_{pj} - O_{pj}) O_{pj} (1 - O_{pj})$$

if linear node are used:

$$\delta_{pj} = (T_{pj} - O_{pj})$$

Where $T_{pj}$ is the desired output for node j after presentation of the input/output vector pair p. To calculate the error signals for the sigmoid 40 nonlinear hidden nodes 32, the errors calculated for the output units are back-propagated using:

$$\delta_{pj} = O_{pj}(1 - O_{pj}) \Sigma \delta_{pk} W_{jk}$$

where $W_{jk}$ is the connection weight between the hidden node j and the output node k. In this way, the weighted sum of the output errors is back-propagated to the hidden node 32.

In the present invention, the training set of input vectors consists of a set of archetypical signals such as an impulse, a ramp, a square wave, a sweeping frequency, single tone frequency, and white noise. Each input-output pair of pattern in the training set consists of the possibly preprocessed Digital Audio Input Signals 17 of set 48 at the input, and the corresponding desired 192 filter coefficients at the output. The training set is not limited to these signals, and others could be used. Moreover, although in the preferred embodiment the signals are classified according to the training set to generate desired filter coefficients, the signals may be classified by other, more general criteria such as the degree of periodicity. This degree of periodicity can then be used to generate filter coefficients.

The desired outputs, which are the coefficients for the digital filter for a particular signal, are determined by the person training the network. Thus, for a certain type of signal, the desired filter configuration must be known, for the neural network 26 to be trained on the signal. However, due to the generalization property of the neural network 26, it is expected that after the network 26 is trained it would generate proper filter coefficients for other new signals such as digital music signals.

The basis for choosing a particular set of coefficients for a given signal is "good" reproduction of the signal. Since the goal of the apparatus is to reconstruct an analog signal from a digital signal, the filter must be configured to accurately reconstruct the digital input signal. A proper set of coefficients will smooth the Digital Audio Input Signals 17 such that the resulting signal is optimally close to the original analog signal. The "goodness" of the neural network coefficient output for archetypal signals, for which suitable filter coefficients are known, can be measured by comparing the coefficients generated by the neural network 26 with the desired coefficients. However, "goodness" of the neural network coefficient output for complex, non-archetypical signals such as digital music will be determined using some form of subjective criterion for the filter output resulting from the generated coefficients, i.e., the listener.

A neural network 26 can be implemented by means of hardware or software. The present invention uses Matlab Software and its Neural Network Toolbox to simulate and train a neural network 26. As a result of this training, a set of connection weights will be generated by the training algorithm. This set of learned connection weights are then transferred from Matlab onto the signal processing means 10, by means of hardware or software. Notwithstanding the depiction of the location of the neural network 26 in the apparatus in FIG. 1, in the preferred embodiment the neural network 26 with the preprocessing means 25 is in the CPU 18 with the DSPs 20, 22. In the preferred embodiment, the DSPs 20, 22, the preprocessing means 25, and the neural network 26 are all software based. If this neural network 26 is implemented as software, then the weights, which are matrices of numbers would be transferred to the neural network 26 on the DSP chip 20, 22. A compiled feed forward neural network program located on the DSP chip 20, 22, with connection weights equal to the transferred weight matrices, would implement the neural network 26. If the neural network 26 would be implemented in hardware, then the weights will be burned into the hardware circuitry.

During the operation of the system, Input Data 11 is separated into a Timing Data 21 signal and a Digital Audio Input Signal 17. This Digital Audio Input Signal 17 is a real time representation of an analog signal, which is accumulated in a buffer 28 until there are 256 16-bit representations. (These 16-bit representations do not include samples with 0 magnitude which are added in the time-domain interpolation process to provide oversampling of the signal.) If the signal is to be preprocessed, the set 48 of Digital Audio Input Signals 17, i.e., the contents of buffer 28 with 256 16-bit representations, is converted into other domain representations using the preprocessor 25 and are stored in buffer 50 of the Digital Audio Input Signals 17. The trained neural network 26 classifies the 256 16-bit signals and generates a set of 192 coefficients, ranging from 0 to 1. These coefficients are used to configure the digital filter as a brickwall filter, a monotonic filter, or a blended filter having characteristics of both the brickwall filter and the monotonic filter, depending on the set 48 of Digital Audio Input Signals 17.

The coefficients outputted by the neural network 26 are based on the 256 16-bit representations of the set 48 of Digital Audio Input Signals 17 and the various signals and corresponding coefficients on which the neural network 26 has been trained. If a new set 48 of Digital Audio Input Signals 17 presented to the neural network 26 is not one of the trained signal types, the neural network 26 will produce proper coefficients for the new set 48 which are determined by the learned weights of the neural network 26 and will vary from the coefficients for the learned signals. This characteristic is known as "generalization". When the weights in the neural network 26 are set properly (i.e., the network is trained properly), then the neural network 26 has the ability to "predict", by generalization, a set of coefficients that will accurately smooth a new set 48 of Digital Audio Input Signals 17.

A set of coefficients are outputted by the neural network 26 for every 16-bit representation, consequently, only one 16-bit representation is added to the set 48 of Digital Audio Input Signals 17 for generating a new set of coefficients.

For instance, if the set 48 of 256 Digital Audio Input Signals 17 are from a pure sine wave (which musically represents a pure tone), then the neural network 26 will produce coefficients that will configure the digital filter to have the characteristics of a brickwall filter. In this situation, a brickwall filter is the most appropriate filter, because it is most suited to smooth pure sinusoids. Whereas if the set 48 of 256 Digital Audio Input Signals 17 sample represents an extremely aperiodic signal such as spiky, brief transient signals, then the neural network 26 will produce coefficients that will configure the digital filter to have the characteristics of a monotonic filter. However, in addition to being able to dynamically change the filter characteristics for the cases for which the neural network 26 has been trained, the neural network 26 can adjust the coefficients to realize filters that have characteristics of both a brickwall filter and a monotonic filter, when the set 48 of 256 Digital Audio Input Signals 17 represent a signal that has both periodic and aperiodic characteristics.

Figure 6:
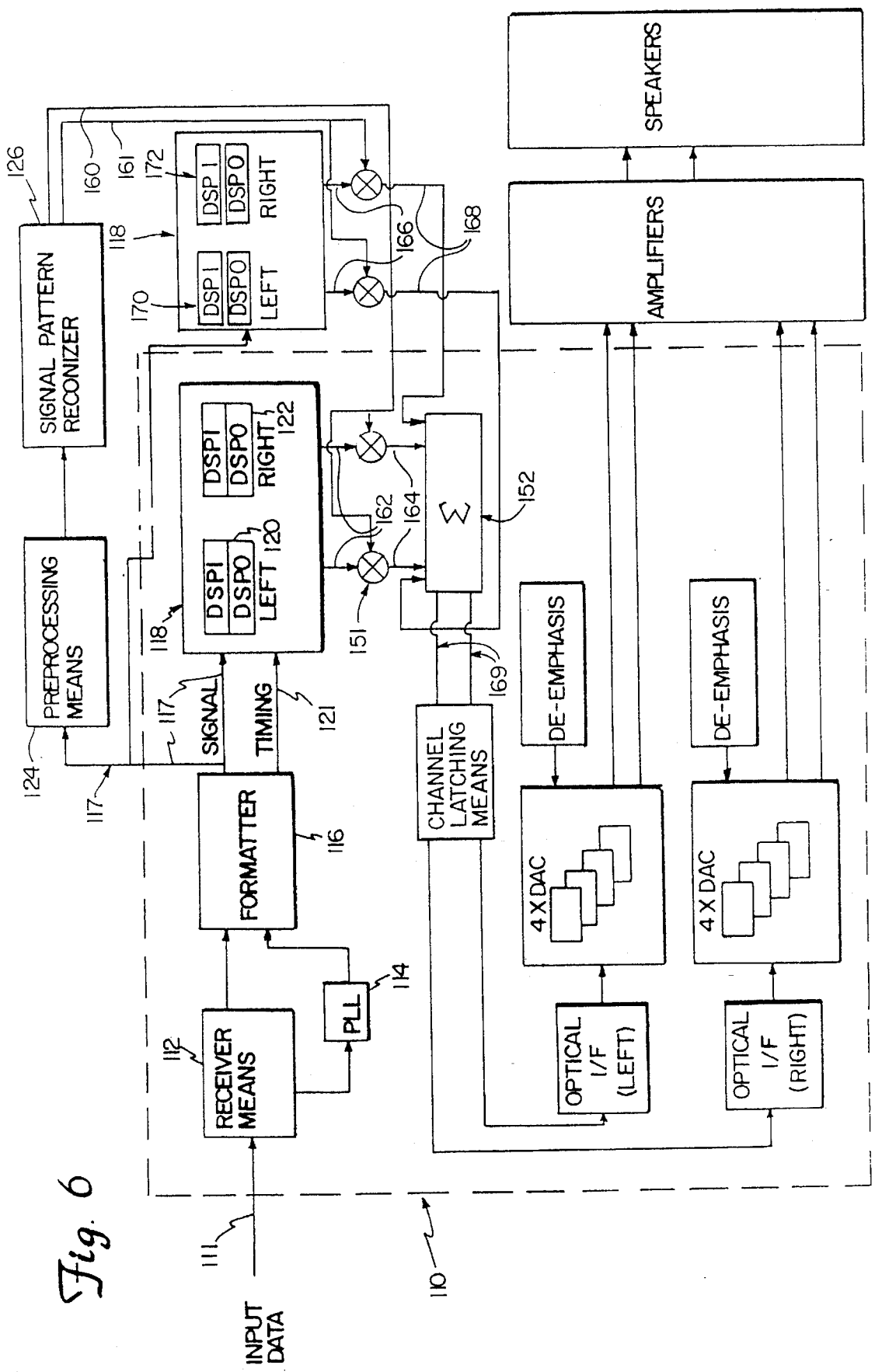
FIG. 6 is a block diagram showing the relationship among the components of a signal processing means in accordance with an alternative embodiment of the present invention.
Figure 8A:
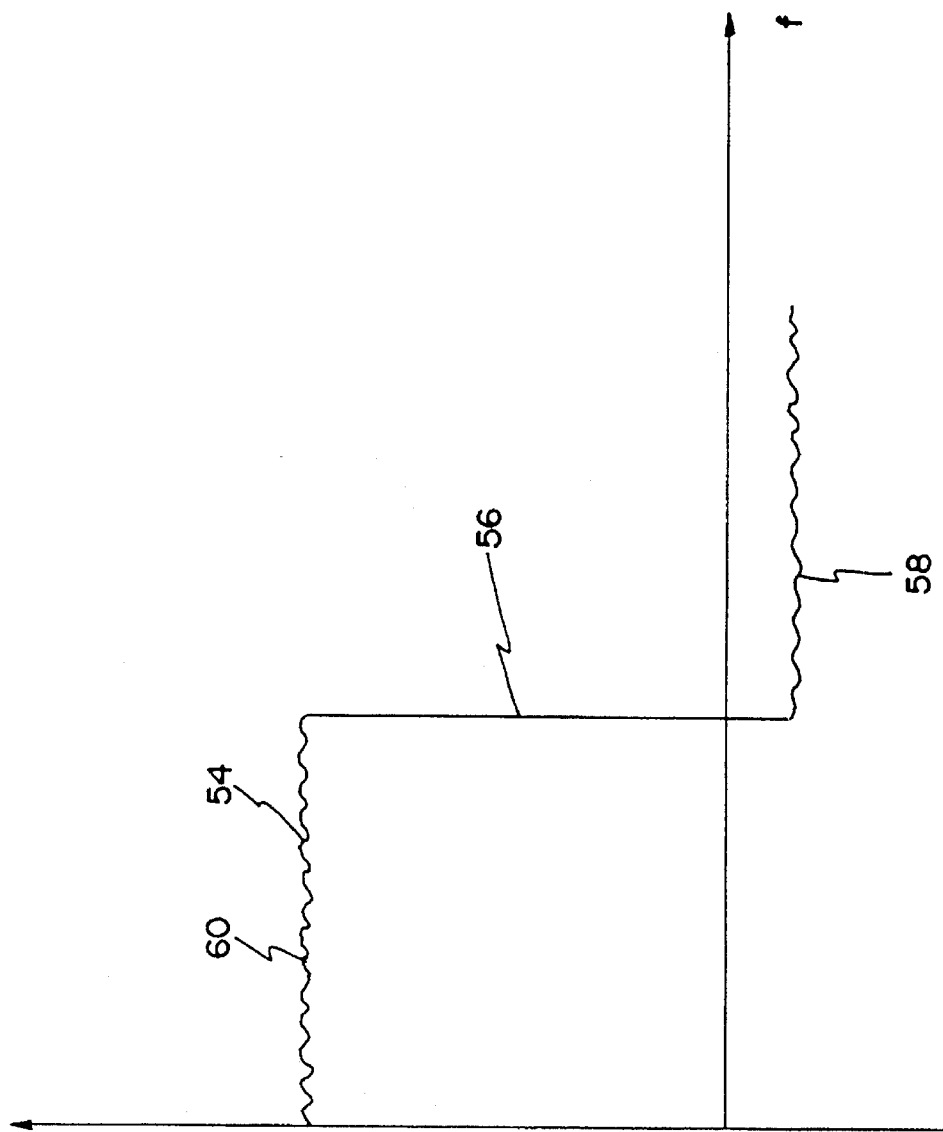
FIG. 8A shows the frequency characteristics of a brickwall low pass filter.
Figure 8B:
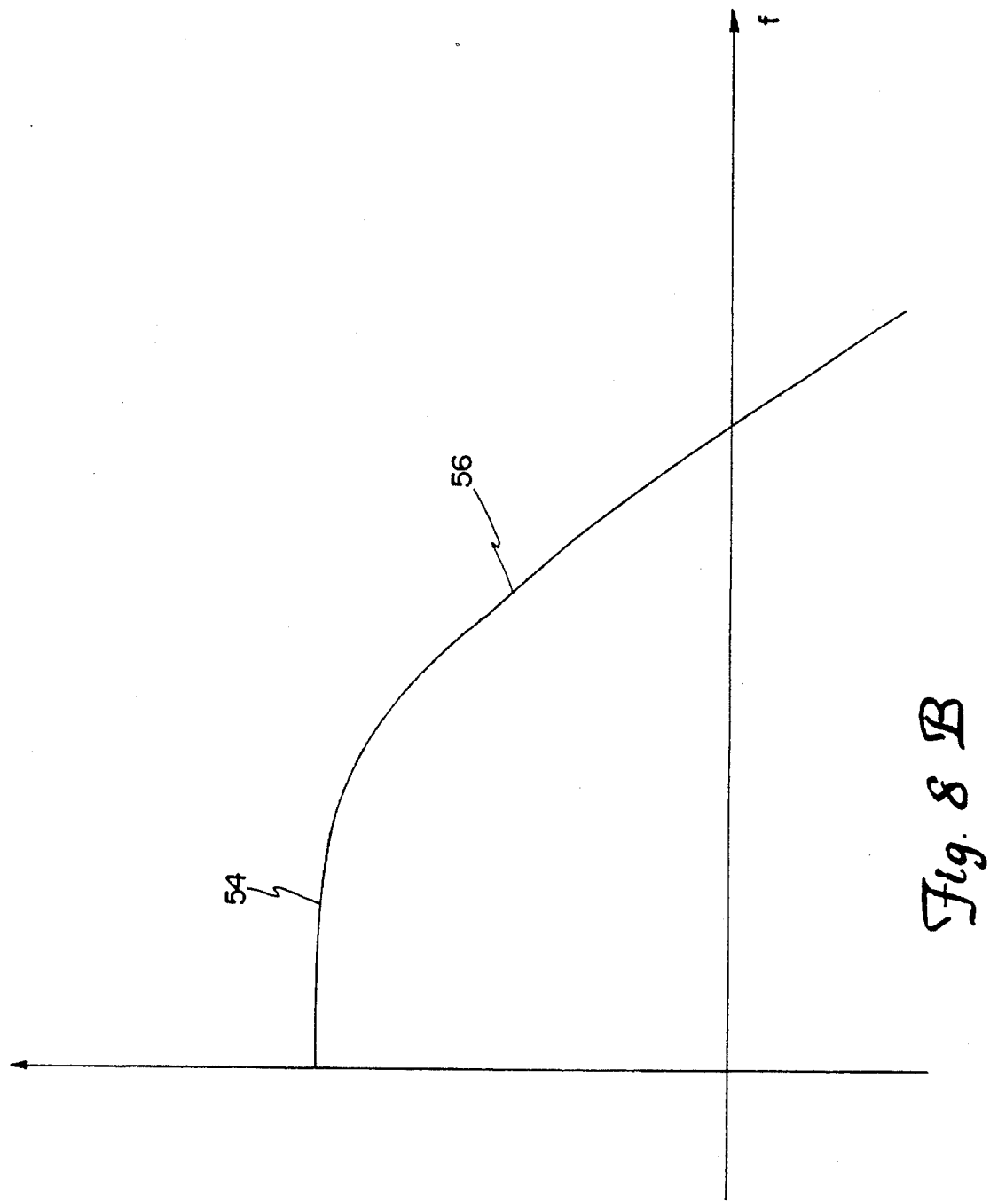
FIG. 8B shows the frequency characteristics of a monotonic low pass filter.

FIG. 6 illustrates another embodiment of the present invention particularly suited for blending filter characteristics. The signal processing means 110 receives Input Data 111 from a digital audio signal source. The Input Data 111 represents digitized samples of the musical material transmitted in a predetermined, conventional format. The Input Data 111 enters a receiver means 112 that synchronizes the Input Data 111 with an internal clock signal via a conventional phase-lock loop means ("PLL") 114. A formatter 116 performs the data demodulation and format decoding of the Input Data 111 to extract the Digital Audio Input Signal 117 and the Timing Data 121 portions of the Input Data 111.

In this embodiment, there is a first set of DSPs 170, 172 which have a first digital filter configured to have the fixed characteristics of a brickwall interpolation filter. There is a second set of DSPs 121, 123 which have a second digital filter configured to have the fixed characteristics of a monotonic interpolation filter.

The neural network 126 produces a scaling parameter such as a first weighting signal 160 representing a value between 0 and 1 defining the amount of periodicity in the set 148 of the 256 Digital Audio Input Signals 117 and a second weighting value 161 defining the amount of aperiodicity (as shown in FIG. 7).

The first DSPs 120, 122 have a first set of multipliers 151 that receives the first Interpolated Signal 162 and, as a second input, the first weighting signal 160 representing the periodicity because the digital filters in the first set of DSPs 120, 122 have a fixed brickwall filter configuration. The multiplier 151 will output a first multiplied signal 164 which is the product of the First Interpolated Signal 162 from a brickwall filter and a first weighting signal 160 representing the periodicity of the set 148 of the 256 Digital Audio Input Signals 117 corresponding to the 16-bit representations being filtered.

The second set of DSPs 170, 172 has a second set of multipliers 151 that receives a second Interpolated Signal 166 and, as a second input, the second weighting signal 161 representing the aperiodicity of the set 148 of the 256 Digitized Audio Input Signals 117 because the digital filters in the second set of DSPs 171, 173 have a fixed monotonic filter configuration. The multipliers 151 will output the second multiplied signal 168 which is the product of the second Interpolated Signal 166 from a monotonic filter and a second weighting signal 161 representing the aperiodicity of the set 148 of the 256 Digital Audio Input Signals 117 corresponding to the 16-bit representations being filtered.

The first and second multiplied signals 164, 168 are inputted into the summer 152, for each of the right and left channels. The summer 152 adds the first and second multiplied signals 164, 168 and outputs a filtered digital signal.

Figure 9A:
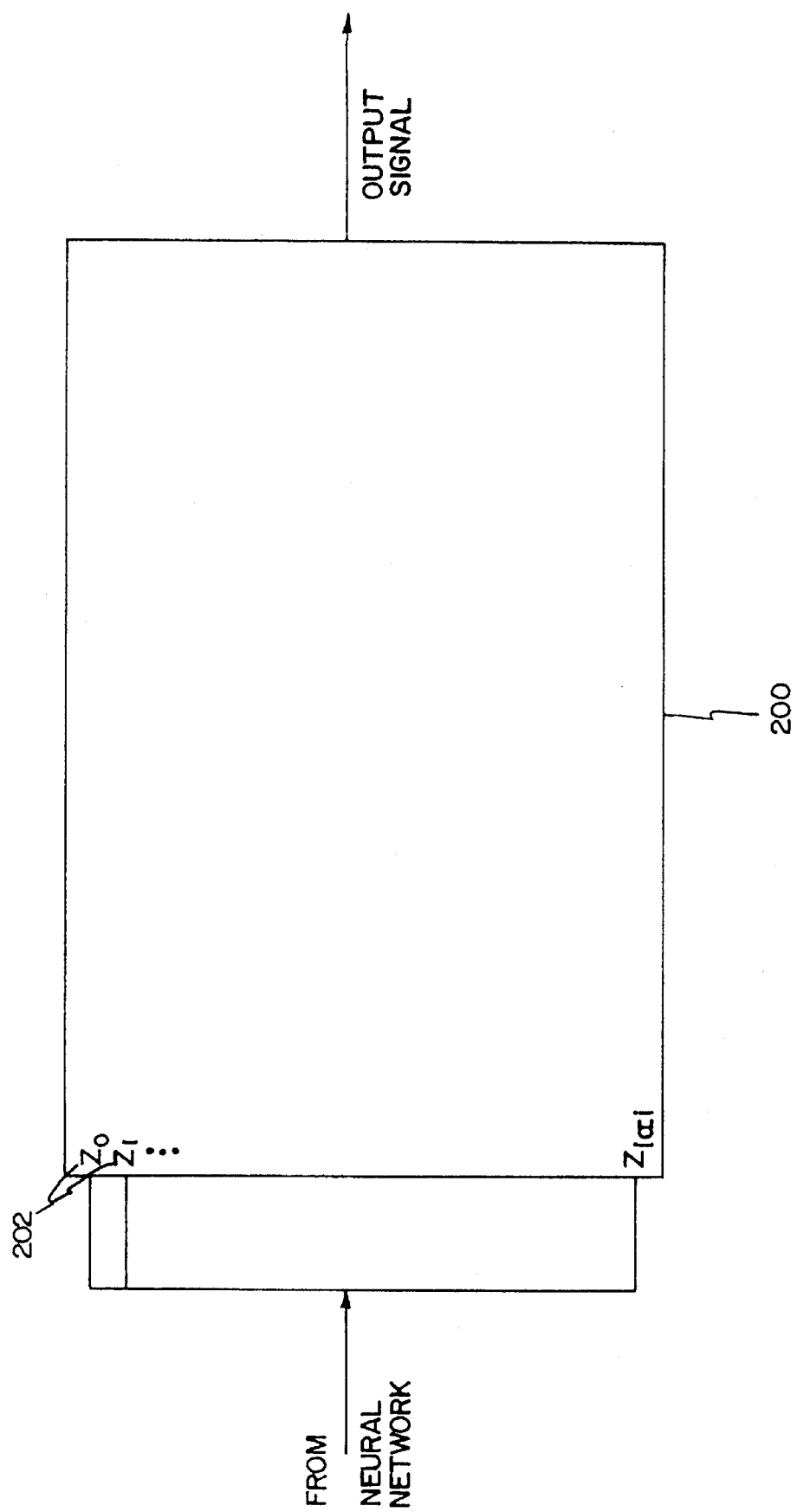
FIG. 9A shows a block diagram representing a filter.
Figure 9B:
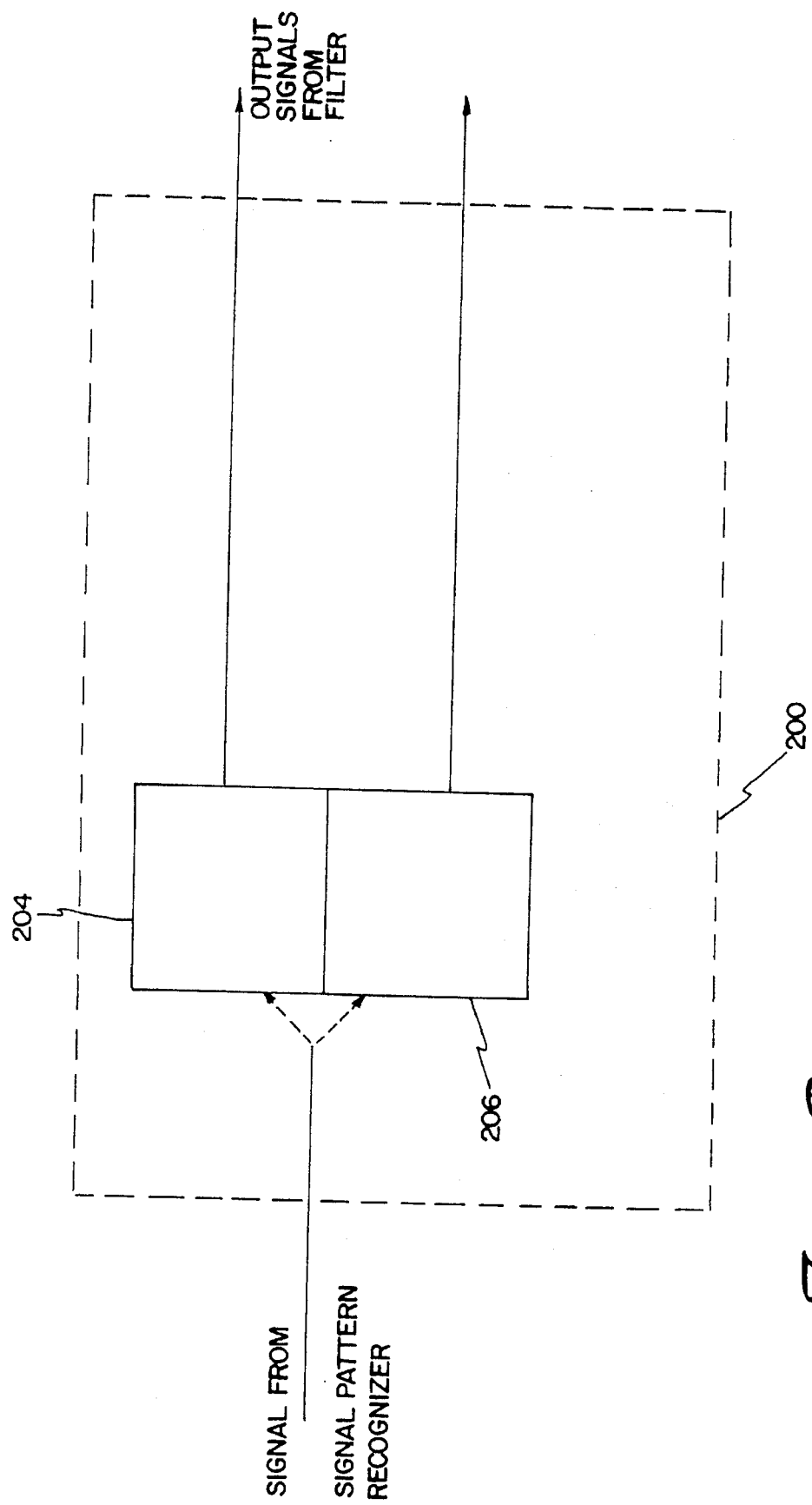
FIG. 9B shows a block diagram representing a filter with two fixed filters.

FIGS. 9A, 9B, and 9C illustrate a filter 200. Although the DSPs 20, 22 use software to implement a digital filter, the FIGS. 9A, 9B, and 9C represent a filter which could be implemented in the DSPs 20, 22.

FIG. 9A illustrates a filter 200 with 192 taps 202. In the embodiment shown in FIG. 9A, the neural network 26 must output digital filter parameters which in this case are 192 coefficients to configure the filter 200. If the filter 200 has greater than or less than 192 taps, then the neural network 26 must output filter parameters which would be the requisite number of coefficients to configure the filter.

FIG. 9B illustrates a filter having two fixed digital filters 204, 206. In this embodiment, the neural network 26 would output a digital filter parameter, which would be a 0 or a 1 to choose one of the two fixed digital filters 204, 206 to be the configuration of the filter 200. While FIG. 9B shows this embodiment with two fixed filter configurations, this choosing of a fixed filter configuration by the output of the neural network 26 could be done with any number of fixed filters.

FIG. 9C illustrates a filter 200 having two fixed filters 204, 206, two multipliers 151, and a summer 152. The Digital Audio Input Signal 17 is inputted into each fixed filter. The neural network 26 outputs digital filter parameters which in this case are weighting signals. The first weighting signal is a numerical indication of the degree to which the set 48 of Digital Audio Input Signals 17 contains a certain predetermined characteristic. The second weighting signal is a numerical indication of the degree to which the set 48 of Digital Audio Input Signals 17 contains another predetermined characteristic. For instance, one such set of predetermined characteristics that is used is the periodicity and aperiodicity of a signal. In this embodiment, the digital filter 200 is configured by these weighting values, which affects the signal being outputted by the filter.

While preferred embodiments of the present invention have been described, it should be appreciated that various modifications may be made by those skilled in the art without departing from the spirit and scope of the present invention. Accordingly, reference should be made to the claims to determine the scope of the present invention.

We claim:

1. An apparatus for reconstructing an audio input signal, comprising:

means for receiving a plurality of digital audio input signals provided by a digital signal source representing samples of the audio input signal;

a trained neural network, which is a result of a set of training signals with corresponding filter coefficients previously taught to the neural network, responsive to the digital audio input signals to dynamically provide digital filter coefficients wherein the coefficients are produced based on the digital audio input signals received, unaccompanied by any training signals;

a digital filter for producing a digital audio output signal for reconstruction of the audio input signal, said filter receiving the digital audio input signals and the coefficients provided by the neural network, wherein said coefficients dynamically configure the digital filter to produce a filtered digital audio output signal.

2. The apparatus for reconstructing an audio input signal as recited in claim 1, wherein said means for receiving comprises a pre-processor means for outputting processed digital audio input signals to the neural network.

3. The apparatus for reconstructing an audio input signal as recited in claim 1, wherein said neural network produces one of two sets of coefficients, whereby when a digital audio input signal is received by the neural network, the neural network classifies the input signal in one of two categories and responsive to the category outputs to the digital filter a corresponding one of the two sets of coefficients.

4. An apparatus for reconstructing an audio input signal, comprising:

means for receiving a plurality of digital audio input signals provided by a digital signal source representing samples of the audio signal;

a neural network responsive to the digital audio input signals to dynamically provide a first weighting signal which indicates the extent to which the digital audio input signals correspond to a first predetermined signal characteristic and a second weighting signal which indicates the extent to which the digital audio input signals correspond to a second predetermined signal characteristic;

a first digital filter configured for smoothing a first class of digital audio input signals, wherein said first digital filter receives the digital audio input signals and produces a first interpolated audio signal at its output;

a second digital filter designed for smoothing a second class of digital audio input signals, wherein said second class is complementary to the first class of digital audio input signals and said second digital filter receives the digital audio input signals and produces a second interpolated audio signal at its output;

a first multiplier receiving the first interpolated audio signal and the first weighting signal from the neural network, whereby the first multiplier will output a first multiplied signal which is the product of the first interpolated audio signal received at its input and the first weighting signal;

a second multiplier receiving the second interpolated audio signal and the second weighting signal from the neural network, whereby the second multiplier will output a second multiplied signal which is the product of the second interpolated audio signal received at its input and the second weighing signal;

a summer which receives the first and second multiplied signals and combines the first multiplied signal and the second multiplied signal to output a filtered composite digital signal.

5. The apparatus for reconstructing an audio input signal as recited in claim 4, wherein the apparatus further comprises a pre-processor means for outputting processed digital audio input signals to the neural network.

6. The apparatus for reconstruction of an audio input signal as recited in claim 5, wherein the first digital filter is configured for filtering periodic signals.

7. The apparatus for reconstruction of an audio input signal as recited in claim 6, wherein the second digital filter is configured for filtering aperiodic signals.

8. A method for reconstructing an audio input signal comprising the steps of:

training a neural network on a set of training signals to produce filter coefficients corresponding to predetermined characteristics of the training signals;

receiving a plurality of digital audio input signals provided by a digital signal source;

providing the plurality of digital sample audio input signals to the trained neural network and a digital filter;

providing to the digital filter, filter coefficients from the trained neural network based on the digital audio input signals received, unaccompanied by any training signals; and filtering the digital audio input signal with the digital filter, said digital filter being dynamically configured by the filter coefficients to correspond to the digital audio input signal.

9. The method for reconstructing an audio input signal as recited in claim 8, further comprising the step of preprocessing the digital audio input signal in the processing means to output processed digital audio input signals.

10. An adaptable digital filter comprising:

means for receiving a plurality of digital input signals provided by a digital signal source;

a trained neural network, which is a result of a set of training signals with corresponding at least one predetermined digital filter parameter previously taught to the neural network, responsive to said digital input signals to provide at least one digital filter parameter based on the digital input signals received, unaccompanied by any training signals;

a digital filter which dynamically receives the digital input signals and the at least one digital filter parameter from the neural network, and the at least one digital filter parameter provided by the neural network dynamically configures the digital filter.

11. A method for dynamically configuring a digital filter comprising the steps of:

training a neural network on a set of training signals with at least one corresponding predetermined digital filter parameter;

providing digital input signals to the trained neural network;

dynamically developing at least one digital filter parameter in the trained neural network based on the digital input signals received, unaccompanied by any training signals; and dynamically transferring said at least one digital filter parameter to the digital filter, the at least one digital filter parameter configures the digital filter in response to the digital input signals.

12. An apparatus for filtering digital signals comprising:

means for receiving a plurality of varying digital input signals in time-ordered sequence;

a digital filter communicating with the means for receiving, said filter having at least one filter parameter that can be selectively set to two or more values, each value associated with different filter characteristics;

a signal pattern recognizer communicating with the digital filter and the means for receiving, said recognizer being responsive to said plurality of input signals to selectively set the at least one filter parameter to one of said two or more values, and said recognizer being trained to selectively set the at least one filter parameter based on the input signals received, unaccompanied by any training signals, at a value associated with optimal filter characteristics for a particular time-ordered sequence of varying digital input signals.

13. The apparatus for filtering digital signals as recited in claim 12, wherein the plurality of input signals comprises a time-ordered sequence of digital samples representing analog material.

14. The apparatus for filtering digital signals as recited in claim 13, wherein:

the time-ordered sequence of signals comprises a mix of both periodic and non-periodic elements;

the at least one filter parameter can be set to a plurality of different values, corresponding to equiripple filter characteristics, monotonic filter characteristics, and blends of equiripple and monotonic filter characteristics; and the recognizer is responsive to the mix of periodic and non-periodic elements to selectively set the digital filter parameter to a value that corresponds to optimal filter characteristics for a particular mix of both periodic and non-periodic elements.

15. The apparatus for filtering digital signals as recited in claim 13, wherein the at least one filter parameter can be set to two different values, a first value corresponding to equiripple filter characteristics and a second value corresponding to monotonic filter characteristics.

16. The apparatus for filtering digital signals as recited in claim 15, wherein the recognizer is responsive to a time-ordered sequence of input signals that is periodic to selectively set the digital filter parameter to the first value and is responsive to a time-ordered sequence of signals that is non-periodic to selectively set the digital filter parameter to the second value.

17. The apparatus of claim 14 wherein the plurality of input signals comprises a time-ordered sequence of digital samples representing analog audio material.

18. The apparatus for filtering digital signals as recited in claim 12, wherein:

the recognizer selectively sets as the at least one filter parameter, a first weighting signal and a second weighting signal, each of said signals being associated with the filter characteristics of one of an equiripple filter and a monotonic filter, respectively; and the digital filter comprises:

two digital filters, a first having equiripple filter characteristics and producing a first filter output and a second having monotonic filter characteristics and producing a second filter output;

a first multiplier receiving said first weighting signal and said first output and outputting a first multiplied signal;

a second multiplier receiving said second weighting signal and said second output and outputting a second multiplied signal; and a summer receiving said first and second multiplied signals and outputting the sum of both signals.

19. The apparatus of claim 12 wherein the recognizer is a neural network.

20. The apparatus of claim 12 wherein the recognizer is a spectral flatness analyzer.

21. A method for filtering sample digital signals comprising the steps of:

training a neural network on a set of training signals with at least one corresponding filter parameter for each training signal;

providing digital signals to said trained neural network and a digital filter;

providing to the digital filter, the at least one filter parameter from the trained neural network, said at least one filter parameter based on the digital signal provided to the neural network unaccompanied by any training signal; and filtering the digital signal with the digital filter, said digital filter being dynamically configured by the at least one filter parameter to correspond to the digital input signal.

* * * * *

UNITED STATES PATENT AND TRADEMARK OFFICE
CERTIFICATE OF CORRECTION

PATENT NO. : 5,532,950
DATED : July 2, 1996
INVENTOR(S) : Donald W. Moses, Charles H. Hustig, James Kinne, and Hossein L. Najafi It is certified that error appears in the above-indentified patent and that said Letters Patent is hereby corrected as shown below:

In column 9, line 9, delete "where $\Delta_p$ is $W_{ij}$" and insert --where $\Delta_p W_{ij}$ is--.

Signed and Sealed this

Twenty-ninth Day of October 1996

*Attest:*

BRUCE LEHMAN

*Attesting Officer*    *Commissioner of Patents and Trademarks*